United States Patent
Racz et al.

(10) Patent No.: US 10,854,793 B2
(45) Date of Patent: Dec. 1, 2020

(54) METHOD FOR PRODUCING AN OPTOELECTRONIC COMPONENT AND OPTOELECTRONIC COMPONENT

(71) Applicant: OSRAM Opto Semiconductors GmbH, Regensburg (DE)

(72) Inventors: David Racz, Regensburg (DE); Matthias Sperl, Mintraching (DE)

(73) Assignee: OSRAM OLED GMBH, Regensburg (DE)

( * ) Notice: Subject to any disclaimer, the term of this patent is extended or adjusted under 35 U.S.C. 154(b) by 9 days.

(21) Appl. No.: 16/098,172

(22) PCT Filed: May 10, 2017

(86) PCT No.: PCT/EP2017/061218
§ 371 (c)(1),
(2) Date: Nov. 1, 2018

(87) PCT Pub. No.: WO2017/194623
PCT Pub. Date: Nov. 16, 2017

(65) Prior Publication Data
US 2019/0148606 A1 May 16, 2019

(30) Foreign Application Priority Data

May 11, 2016 (DE) .................. 10 2016 108 682

(51) Int. Cl.
*H01L 33/50* (2010.01)
*H01L 33/00* (2010.01)
(Continued)

(52) U.S. Cl.
CPC ........ *H01L 33/505* (2013.01); *H01L 33/0093* (2020.05); *H01L 33/36* (2013.01);
(Continued)

(58) Field of Classification Search
CPC ... H01L 33/0079; H01L 33/50; H01L 33/505; H01L 33/0093; H01L 33/36; H01L 33/46;
(Continued)

(56) References Cited

U.S. PATENT DOCUMENTS 8,853,732 B2 10/2014 Muller et al.
2011/0266569 A1 11/2011 Basin et al.
(Continued)

FOREIGN PATENT DOCUMENTS

DE 102008039790 A1 3/2010
DE 102009051746 A1 3/2011
(Continued)

OTHER PUBLICATIONS

"Monocrystalline Luminophore for High-power LEDs, New Dimension in Phosphors," Cryphospor TM Monocrystalline High-Efficiency Phosphors, Datasheet: CRYTUR, spol. s.r.o., Turnov, Czech Republis, www.crytur.com, 2018, 2 pages.

*Primary Examiner* — Quoc D Hoang
(74) *Attorney, Agent, or Firm* — Slater Matsil, LLP

(57) ABSTRACT

An optoelectronic component and a method for producing an optoelectronic component are disclosed. In an embodiment a method includes providing at least one light-emitting semiconductor chip comprising a sapphire substrate and an epitaxially grown layer sequence, arranging the light-emitting semiconductor chip with a side facing away from the sapphire substrate on a carrier, detaching the sapphire substrate from the semiconductor chip, applying a converter element on a region of the semiconductor chip in which the sapphire substrate was detached, arranging the semiconductor chip on an auxiliary carrier so that the converter element faces the auxiliary carrier and detaching the carrier from the semiconductor chip.

17 Claims, 3 Drawing Sheets

(51) Int. Cl.
  *H01L 33/36* (2010.01)
  *H01L 33/46* (2010.01)
  *H01L 33/54* (2010.01)
  *H01L 33/32* (2010.01)
  *H01L 33/56* (2010.01)

(52) U.S. Cl.
  CPC .............. *H01L 33/46* (2013.01); *H01L 33/54* (2013.01); *H01L 33/0095* (2013.01); *H01L 33/32* (2013.01); *H01L 33/50* (2013.01); *H01L 33/56* (2013.01); *H01L 2933/005* (2013.01); *H01L 2933/0041* (2013.01); *H01L 2933/0091* (2013.01)

(58) Field of Classification Search
  CPC ..... H01L 33/54; H01L 33/0095; H01L 33/32; H01L 33/56; H01L 2933/0041
  See application file for complete search history.

(56) References Cited

U.S. PATENT DOCUMENTS

| | | | |
|---|---|---|---|
| 2012/0074441 A1* | 3/2012 | Seo | H01L 27/153 257/91 |
| 2017/0005079 A1 | 1/2017 | Hoeppel | |
| 2017/0018695 A1 | 1/2017 | Herrmann et al. | |
| 2018/0198037 A1 | 7/2018 | Leirer et al. | |

FOREIGN PATENT DOCUMENTS

| | | |
|---|---|---|
| DE | 102012217776 A1 | 6/2014 |
| DE | 102014100772 A1 | 7/2015 |
| DE | 102015109413 A1 | 12/2016 |
| WO | 2012110009 A1 | 8/2012 |
| WO | 2015124464 A1 | 8/2015 |

* cited by examiner

METHOD FOR PRODUCING AN OPTOELECTRONIC COMPONENT AND OPTOELECTRONIC COMPONENT

This patent application is a national phase filing under section 371 of PCT/EP2017/061218, filed May 10, 2017, which claims the priority of German patent application 10 2016 108 682.7, filed May 11, 2016, each of which is incorporated herein by reference in its entirety.

TECHNICAL FIELD

The invention relates to a method for producing an optoelectronic component and to an optoelectronic component.

SUMMARY OF THE INVENTION

Embodiments provide an improved method for producing an optoelectronic component and an optoelectronic component, which is characterized by a flat design, improved thermal connection to a converter element, and improved efficiency in the white light emission.

In an embodiment, in a method step A), a method for producing the optoelectronic component comprises providing at least one light-emitting semiconductor chip comprising a sapphire substrate and an epitaxially grown layer sequence. In a further method step B), the method comprises arranging the light-emitting semiconductor chip with a side facing away from the sapphire substrate onto a carrier, and in a further method step C) detaching the sapphire substrate from the semiconductor chip. In a further method step D), the method comprises applying a converter element on a region of the semiconductor chip in which the sapphire substrate has been detached, and in a further method step E) arranging the semiconductor chip on an auxiliary carrier so that the converter element faces the auxiliary carrier. In a further method step F), the method comprises a detachment of the carrier from the semiconductor chip.

The semiconductor chip may advantageously be formed in a flip-chip design. Furthermore, the semiconductor chip advantageously comprises contact points, which are arranged on a same side, which faces away from a radiation side of the semiconductor chip. When arranging the semiconductor chip, the contact points are advantageously facing the carrier.

After arranging the semiconductor chip on the carrier in method step B), an emission side of the semiconductor chip is advantageously remote from the carrier. The carrier is advantageously a carrier remaining only temporarily in the component during the production of the component.

Advantageously, a thermo-release film is arranged on the carrier on which the semiconductor chip is arranged. A thermo-release film produces good adhesion of the carrier to the semiconductor chip and can be easily removed when heated.

After detachment of the sapphire substrate, for example, by means of laser lift-off, the semiconductor chip is advantageously free of the sapphire substrate at least on the side facing away from the carrier.

In the method step D), the converter element can advantageously be applied to the emitting side of the semiconductor chip facing away from the carrier such that the emitting side is advantageously completely covered by the converter element. Since the converter element is applied to the semiconductor chip in those regions in which the sapphire substrate has been removed, advantageously a good thermal connection of the converter element to the semiconductor chip results. In this way, advantageously, a Stokes shift in the operation of the semiconductor chip and the conversion of light can be reduced or avoided. In the Stokes shift, the wavelength of light shifts between absorption and emission, which effect is temperature dependent. Increasing the efficiency of a white light emitting component is enhanced by the reduction of the Stokes shift.

Furthermore, a particularly flat component can advantageously be produced, since the component itself has a smaller thickness than it would have with the sapphire substrate on the emission side, due to the detachment of the sapphire substrate. The converter element is advantageously characterized in that it is mechanically stable. In other words, the converter element can serve as a supporting element of the semiconductor chip.

The subcarrier on which the semiconductor chip is arranged with the converter element comprises, for example, a polyester (Mylar).

After arranging the semiconductor chip on the auxiliary carrier, the converter element and the auxiliary carrier advantageously serve for the mechanical stability of the semiconductor chip. As a result, it is advantageously possible to reliably detach the carrier from the semiconductor chip in method step F), with the converter element and the auxiliary carrier carrying the semiconductor chip after detachment of the carrier.

According to at least one embodiment of the method the process steps A) to F) take place in the order given.

In accordance with at least one embodiment of the method in method step A), a multiplicity of light-emitting semiconductor chips are provided in a wafer composite.

The wafer composite comprising a multiplicity of semiconductor chips, for example, in the form of flip chips, is advantageously arranged on the carrier such that emission sides of all semiconductor chips are remote from the carrier and advantageous contact points for electrical contacting of the semiconductor chips face the carrier. The arrangement in a wafer composite can be understood in particular to mean that a multiplicity of semiconductor chips are arranged adjacently on a supporting element, for example, a substrate. Even if the plurality of semiconductor chips is transferred to the carrier or the auxiliary carrier, the arrangement of the semiconductor chips on the carrier or the auxiliary carrier can be referred to as a wafer composite. In this way, it is advantageous to arrange the plurality of semiconductor chips on the carrier in one step. The semiconductor chips advantageously retain their position relative to one another during all method steps A) to F). In this case, the carrier has at least one lateral extension which is equal to the lateral extent of the wafer composite of the semiconductor chips. The lateral extent extends perpendicular to a surface normal to the emission side of the semiconductor chip. Advantageously, the lateral extent of the carrier is greater than the lateral extent of the wafer composite. The semiconductor chips are advantageously all of the same type, for example, flip-chips, and these may also be identical. The arrangement of the wafer composite on the carrier takes place, for example, by means of gluing. Thus, in method step B), the semiconductor chips are arranged on the carrier with a side facing away from their emission side. As a result of the production of the component, the auxiliary carrier extends laterally advantageously over all semiconductor chips.

In accordance with at least one embodiment of the method, after the method step F), the wafer composite with the converter element and the auxiliary carrier is separated into a multiplicity of optoelectronic components.

Advantageously, the wafer composite with the plurality of semiconductor chips, even after the carrier has been detached, has sufficient mechanical stability, which is given in particular by the converter element and/or by the auxiliary carrier, so that the wafer compound with the plurality of semiconductor chips can be singulated into a multiplicity of individual optoelectronic components. After separation, each individual component advantageously has a converter element and a section of the auxiliary carrier. In a further method step, the auxiliary carrier is advantageously completely removed after singulation. After removal of the semiconductor chips from the auxiliary carrier, the components are advantageously completely free of the auxiliary carrier.

The semiconductor chips can advantageously be mirrored laterally, whereby an arrangement of a plurality of optoelectronic components can be realized, wherein a component has a high contrast to the adjacent components. The distances between the semiconductor chips can advantageously be 100 μm or less. A reflective layer may in this case cover side surfaces of the semiconductor chip and of the converter element. The reflective layer may comprise, for example, silver, aluminum, a dielectric mirror, or a combination thereof.

According to at least one embodiment of the method, the singulation takes place by means of laser structuring (laser scribing), stealth dicing, plasma dicing or mechanical sawing.

For singulation methods are used which affect the semiconductor chips as little as possible, such as by temperature or mechanical stress.

In accordance with at least one embodiment of the method, the converter element is applied to all semiconductor chips in method step D). The converter element is advantageously applied in the same method step to all semiconductor chips of the wafer composite. Subsequently, the wafer composite is arranged with the plurality of semiconductor chips and the converter element on a subcarrier.

In accordance with at least one embodiment of the method, the converter element is monocrystalline. A converter element is advantageously characterized by a custom-made surface structure, depending on the application. Furthermore, a converter element can be provided precisely in the dimensions necessary for the semiconductor chip or the plurality of semiconductor chips. Thus, depending on the required application adapted surface structure of the converter element can be applied, for example, the surface of the converter element comprises scattering centers in the form of microscopic depressions. The adapted surface structure allows very flat converter elements in which a return reflection of light into the component is reduced. The monocrystalline converter element may, for example, have through holes, with photons being emitted advantageously at the boundaries between the through holes and the converter element in the emission direction from the converter element.

The converter element can advantageously also comprise a stack of a plurality of converter elements which convert, for example, light into different colors. For example, a converter element may comprise a stack with a red and a green monocrystalline converter element.

In accordance with at least one embodiment of the method, the converter element is coated with an adhesive layer and the converter element with the adhesive layer is glued onto the semiconductor chip (s).

The converter element, in the event that it itself has a mechanically stable shape, can be coated with an adhesive layer of an adhesive material, with which it is then advantageously adhered to the semiconductor chip(s) in regions in which the sapphire substrate has been removed. Advantageously, the converter element can also be adhesively bonded to the semiconductor chips on a multiplicity of semiconductor chips in a wafer composite in a precise manner, so that a stable mechanical connection and a good thermal connection are produced. Attaching with the converter element with an adhesive layer is advantageously suitable for a monocrystalline converter element.

According to an embodiment, the adhesive material is transparent and comprises Si.

Transparent silicone is advantageously suitable for thermally bonding a converter element to the semiconductor chips and for producing a mechanically stable connection which has high aging stability.

In accordance with at least one embodiment of the method, the adhesive layer is applied to the converter element by means of spin-coating.

In accordance with at least one embodiment of the method, the converter element is anodically bonded to the epitaxially grown layer sequence.

The converter element, for example, a monocrystalline converter element, can be brought into direct contact with the epitaxially grown semiconductor layer sequence, for example, with an n-doped semiconductor region. In this case, the converter element is applied to a side of the epitaxially grown semiconductor layer sequence intended for radiation. The epitaxially grown semiconductor layer sequence advantageously comprises at least one n-doped and one p-doped semiconductor region, as well as one active zone, and is in particular part of the semiconductor chip. In the case of a multiplicity of semiconductor chips in the wafer composite, each semiconductor chip can advantageously comprise an epitaxially grown semiconductor layer sequence on which a converter element is applied in direct contact.

A converter element, which is anodically bonded to the epitaxially grown semiconductor layer sequence the application of organic material in the converter element or in the connection between the converter element and the semiconductor chip can advantageously be dispensed. In this case, the converter element is suitable for operation at high temperatures, since the component produced in this way has less aging due to the absence of organic material.

In accordance with at least one embodiment of the method, the converter element comprises a converter material which is introduced into glass.

The converter material may advantageously be introduced into glass and comprise, for example, a glass plate or a ceramic with light-converting effect. In this case, the glass plate has a mechanical stability which can stably carry the semiconductor chip or the multiplicity of semiconductor chips in the wafer composite and can be mechanically stable and thermally conductively connected to the chips. Advantageously, several different converter materials can be mixed in the glass. For example, several converter materials may be mixed in a suspension in the glass.

In accordance with at least one embodiment of the method, the converter element comprises or is a ceramic plate.

Furthermore, an optoelectronic component is specified. Preferably, the optoelectronic component is produced by the method described above. That is, all features disclosed for the method are also disclosed for the optoelectronic component and vice versa.

In an embodiment an optoelectronic component comprises a light-emitting semiconductor chip with an epitaxially grown layer sequence with a p-doped semiconductor region, an n-doped semiconductor region and an active zone, wherein the n-doped semiconductor region faces an emission side of the semiconductor chip. The semiconductor chip further comprises a p-contact point and an n-contact point, which are both arranged on a same side of the semiconductor chip, and which are remote from the emission side of the semiconductor chip. Furthermore, the semiconductor chip comprises a mirror layer, which is arranged on the p-doped semiconductor region and faces away from the n-doped semiconductor region, and a converter element, which is arranged on the n-doped semiconductor region and facing away from the p-doped semiconductor region.

The optoelectronic component may not include a substrate because it is removed from the epitaxially grown layer sequence; the mechanical stability is guaranteed by the conversion element. The epitaxially grown layer sequence is advantageously based on a nitride semiconductor material, in particular on semiconductor materials of the material system InAlGaN. The epitaxially grown layer sequence is preferably based on a III-V compound semiconductor material. For example, the semiconductor layer sequence comprises $In_xAl_yGa_{1-x-y}N$, with $0 \leq x \leq 1$, $0 \leq y \leq 1$ and $x+y \leq 1$. In this case, the III-V compound semiconductor material does not necessarily have to have a mathematically exact composition according to one of the above formulas. Rather, it may have one or more dopants as well as additional ingredients that do not substantially alter the physical properties of the material.

Advantageously, the component does not comprise a substrate, since this has been replaced by the epitaxially grown layer sequence in the production method, the mechanical stability of the semiconductor chip is advantageously ensured by the converter element.

The mirror layer, which is arranged on the epitaxially grown layer sequence, has the function of advantageously reflecting in the direction of the contact points and reflecting emitted radiation in the direction of the converter element. In this way, absorption of radiation in the contact points is largely prevented. The mirror layer electrically contacts the p-doped semiconductor region.

The component is advantageously surface mountable at the p- and n-contact points. In particular, the p-contact point and the n-contact point together can form a planar mounting surface for the semiconductor chip.

According to at least one embodiment of the optoelectronic component, the latter comprises an outer encapsulation which encapsulates the semiconductor chip laterally on side surfaces and on a side remote from the emission side, wherein the p-contact point and the n-contact point contact through the outer encapsulation.

The outer encapsulation advantageously protects mesa-flanks of the epitaxially grown layer sequence and the further components of the semiconductor chips from external influences, in particular from the penetration of moisture. The outer encapsulation may, for example, comprise a combination of an $Al_2O_3$ layer preferably deposited by atomic layer deposition (ALD) and a silicon oxide and/or nitride layer.

BRIEF DESCRIPTION OF THE DRAWINGS

Further advantages, advantageous embodiments and developments emerge from the embodiment described below in conjunction with the figures.

Identical or equivalent elements are each provided with the same reference numerals in the figures. The elements shown in the figures and the size ratios of the elements with respect to each other are not to be regarded as true to scale.

DETAILED DESCRIPTION OF ILLUSTRATIVE EMBODIMENTS

Figure 1A:
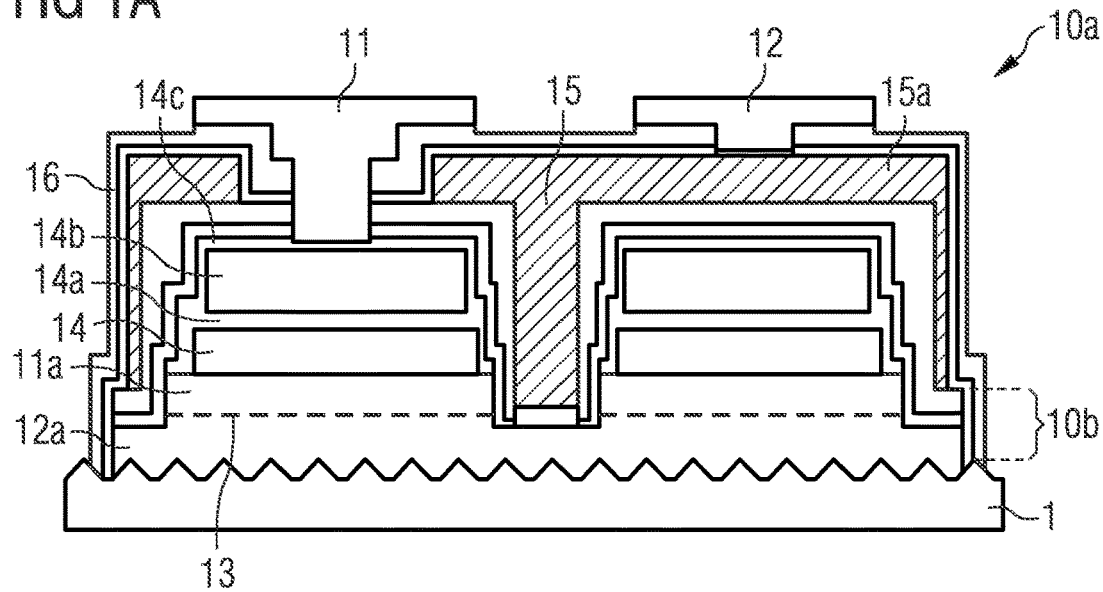
FIG. 1a shows a semiconductor chip provided in method step A) in a schematic side view.

FIG. 1a shows an embodiment of a light-emitting semiconductor chip 10a after provision in method step A). Advantageously, a multiplicity of such semiconductor chips 10a can also be provided in a wafer composite (FIG. 1c). The semiconductor chip 10a is advantageously an LED chip embodied as a flip chip, which comprises an advantageously transparent and clear sapphire substrate 1 on the light emission side.

The semiconductor chip 10a comprises an epitaxially grown layer sequence 10b. The epitaxially grown layer sequence 10b is based on a nitride semiconductor material, in particular on semiconductor materials of the material system InAlGaN.

The epitaxially grown layer sequence 10b has a p-doped semiconductor region 11a, an n-doped semiconductor region 12a and an active zone 13 arranged therebetween, the n-doped semiconductor region 12a being adjacent to the sapphire substrate.

The semiconductor chip 10a advantageously comprises a mirror layer 14 which is arranged on a side of the epitaxially grown layer sequence 10b facing away from the sapphire substrate 1. In particular, the mirror layer 14 is in direct contact with the p-type region 11a. The mirror layer has the function of advantageously reflecting radiation emitted in the direction of contact points 11 and 12 in the direction of the sapphire substrate 1 and the emission side of the semiconductor chip. In this way, absorption of radiation in the contact points 11 and 12 is largely prevented. The mirror layer advantageously comprises silver with a thickness of, for example, 140 nm. The mirror layer electrically contacts the p-doped semiconductor region 11a.

A contact layer 14a is advantageously arranged above the mirror layer and a further contact layer 14b is arranged above the latter, wherein the contact layer 14a comprises a ZnO layer with a thickness of, for example, 70 nm and the further contact layer 14b comprises a metallic layer sequence, in particular a Pt/Au/Cr layer sequence with layer thicknesses of, for example, 40 nm/550 nm/10 nm. The stated numerical values are advantageously valid with a tolerance of +−50%. The Cr layer serves in particular for improving the adhesion of components downstream of the Cr layer, for example, an encapsulation 14c. The mirror layer 14 and the contact layer 14a and the further contact layer 14b advantageously have an encapsulation 14c.

By means of a plated-through hole 15 through the active zone 13, a contacting of the n-doped semiconductor region 12a with the n-contact point 12 takes place.

On the surface facing away from the sapphire substrate 1, the semiconductor chip 10a has a p-contact 11 and an n-contact 12, which may, for example, be composed of several sub-layers, for example, of Ti/Pt layers and an outwardly terminating gold layer. The p-contact point 11 and the n-contact point 12 may advantageously be designed as contact pads.

The semiconductor chip 10a is advantageously surface mountable at the p- and n-contact points 11 and 12. In particular, the p-contact point 11 and the n-contact point 12 may together form a planar mounting surface for the semiconductor chip.

A contact guide 15a, which is connected to the n-contact point 12 and which extends through the through hole 15 is protected to the outside by an electrically insulating outer encapsulation.

In addition to the encapsulation of the mirror layer 14, the semiconductor chip 10a has an outer encapsulation 16 covering the outer sides of the semiconductor chip 10a. In this way, in particular the mesa flanks of the epitaxially grown layer sequence and the contact layers are protected against external influences, in particular against the penetration of moisture. The outer encapsulation 16 may comprise a combination of an $Al_2O_3$ layer preferably deposited by atomic layer deposition (ALD) and a silicon oxide- and/or nitride-layer.

Figure 1B:
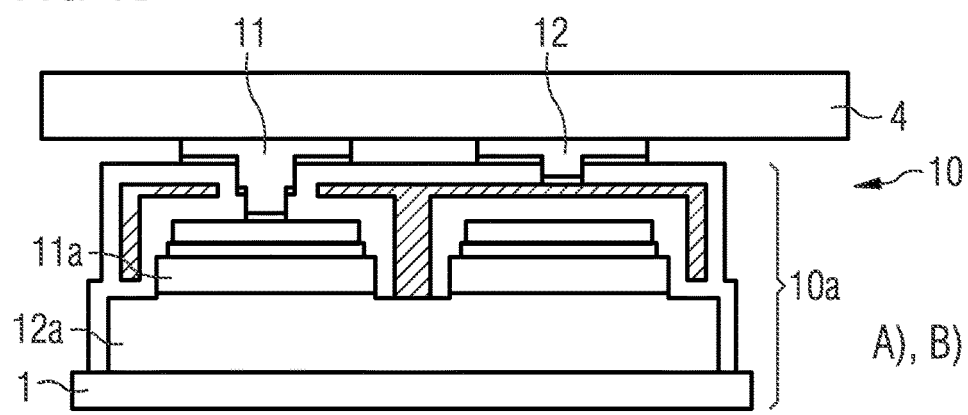
FIG. 1b shows the optoelectronic component in a schematic side view during the method for the production.
Figure 1C:
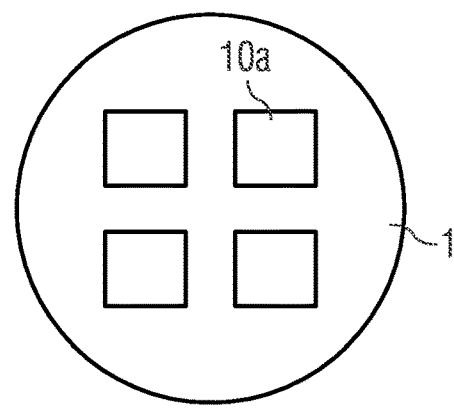
FIG. 1c shows a multiplicity of semiconductor chips in a wafer composite.

FIG. 1b shows, in a schematic side view, the optoelectronic component 10 after method steps A) and B), wherein method steps A) and B) are carried out in the order indicated. The light-emitting semiconductor chip 10 a is arranged on the carrier 4 with a side facing away from the sapphire substrate 1.

It is advantageously possible that a multiplicity of semiconductor chips 10a are arranged in a wafer composite and are arranged on a single carrier 4 in the same way as is the case for a single semiconductor chip 10a.

The semiconductor chip boa is advantageously glued to the carrier 4, it being possible for the carrier 4 to be a thermo-release film, which is arranged on a rigid carrier. The thermo-release film and the rigid carrier in this case advantageously form the carrier 4. The carrier 4 is mechanically stable, so that the semiconductor chip 10a, or a multiplicity of semiconductor chips, can be arranged mechanically stably on the carrier 4.

FIG. 1c shows a multiplicity of semiconductor chips 10a in a wafer composite. The semiconductor chips 10a are advantageously all arranged on a supporting element, for example, a sapphire substrate 1. FIG. 1c shows a top view of the sapphire substrate 1. The semiconductor chips 10a can advantageously be arranged at equal distances from each other.

Figure 2:
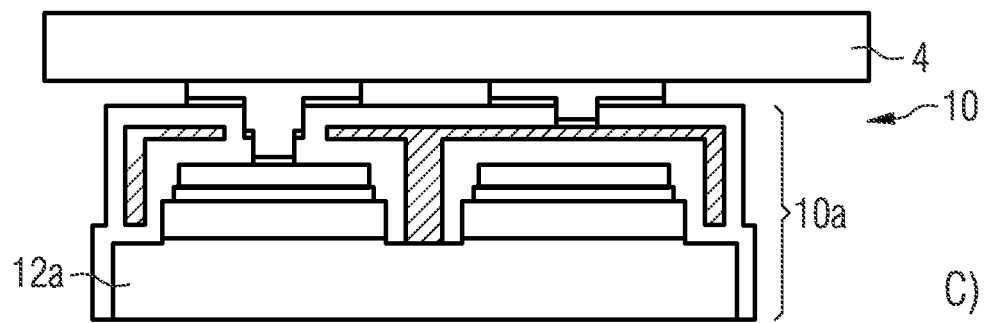
FIGS. 2, 3, 4 and 5 show the optoelectronic component in schematic side views during the process for production.

FIG. 2 shows a schematic side view of the component 10 after a method step C). After arranging the semiconductor chip 10a on the carrier 4, the sapphire substrate was detached from the semiconductor chip 10a, for example, by means of laser lift-off. Advantageously, the sapphire substrate was completely removed from the emission side, after which, after a method step C), the n-doped semiconductor region 12a of the semiconductor chip 10a is advantageously exposed on a side of the semiconductor chip 10a facing away from the carrier 4.

Figure 3:
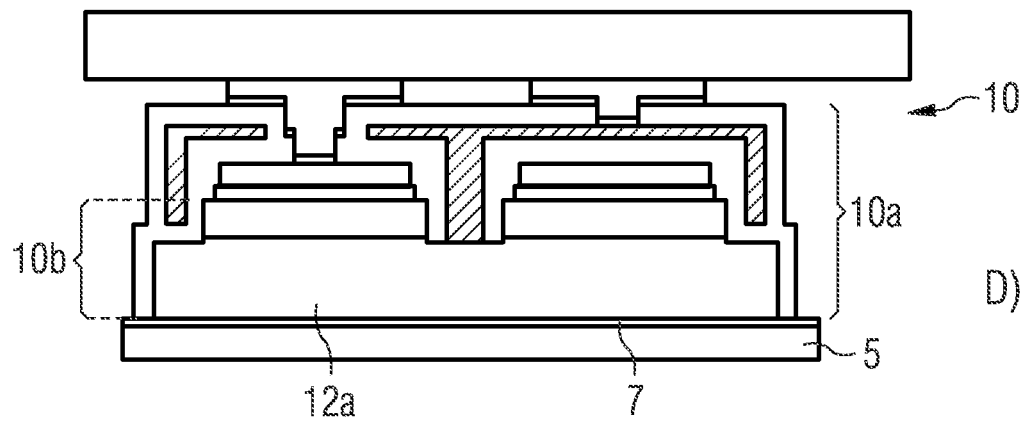

FIG. 3 shows, in a schematic side view, the component 10 from FIG. 2 after a method step D). On the side of the semiconductor chip 10a from which the sapphire substrate 1 has been detached in method step C), a converter element 5 is applied in method step D). Advantageously, the converter element 5 is applied to the n-doped semiconductor region 12a of the semiconductor chip 10a. The converter element 5 can advantageously be a monocrystalline converter element or a glass plate with a converter material introduced therein. This may advantageously be a ceramic plate as a converter element. In the case of a monocrystalline converter element, for example, a cryophosphorus can be used, as for example produced by Crytur or Hitachi. The monocrystalline converter element may advantageously comprise a stack of a plurality of converter elements. The converter element 5 was advantageously provided with an adhesive layer 7 before application, and is adhered to the semiconductor chip 10a in method step D). The adhesive layer 7 comprises, for example, clear and transparent silicone which has been applied to the converter element 5 by means of spin coating.

Alternatively, the converter element 5 can also be applied to the epitaxially grown layer sequence 10b by means of anodic bonding. The application of an adhesive layer is not necessary here.

After a method step D), the semiconductor chip 10a has a mechanically stable connection with the converter element 5, which is advantageously thermally well connected to the semiconductor chip 10a.

Figure 4:
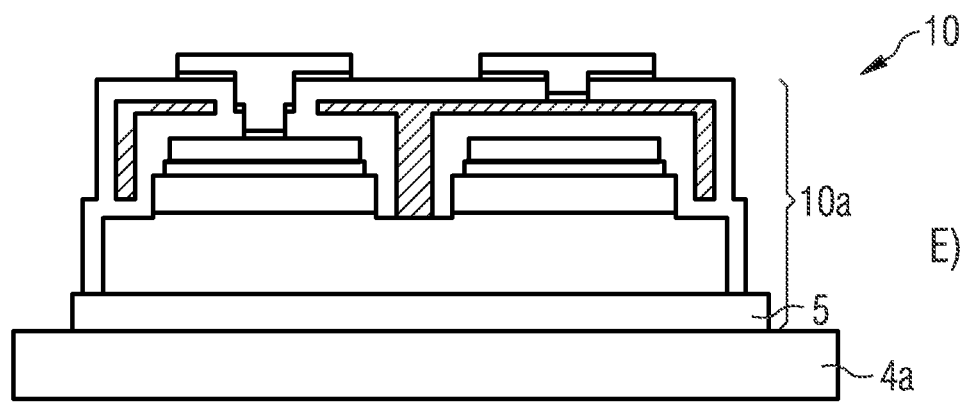

FIG. 4 shows, in a schematic side view, the component 10 from FIG. 3 according to method steps E) and F).

The semiconductor chip 10a is arranged on an auxiliary carrier 4a (method step E)), the converter element 5 facing the auxiliary carrier 4a, and a detachment of the carrier 4 from the semiconductor chip 10a (method step F)). After method step E), the converter element 5 is mechanically stably connected to the auxiliary carrier 4a.

The process steps D) and E) can advantageously also take place simultaneously.

Figure 5:
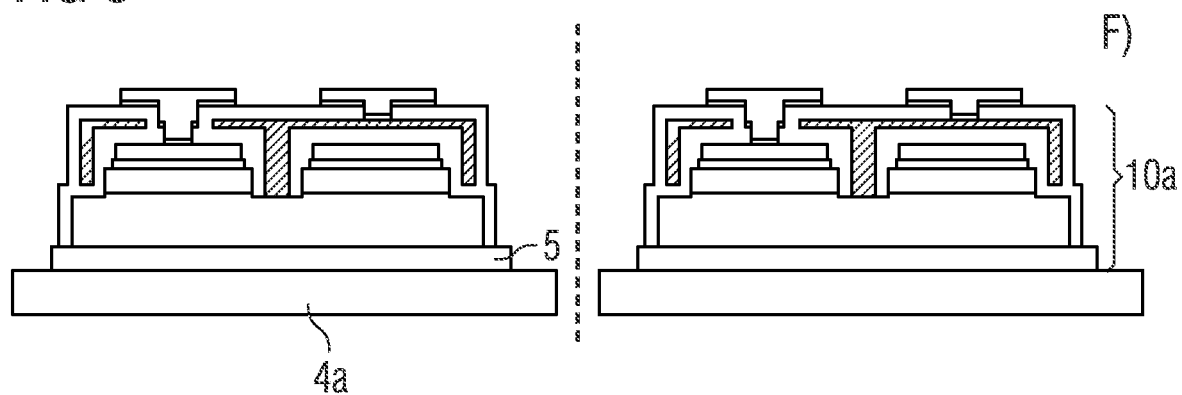

FIG. 5 shows, in a schematic side view, the semiconductor chip 10a from FIG. 4, wherein a further semiconductor chip 10a is arranged on the auxiliary carrier 4a. The semiconductor chips were advantageously provided in a wafer composite and the method steps B) to F) were carried out in the stated sequence on the semiconductor chips in the wafer compound. In the wafer compound, a multiplicity of semiconductor chips 10a is advantageously provided in method step A). For ease of illustration, only two semiconductor chips 10a are shown in FIG. 5.

The converter element can advantageously stabilize the semiconductor chip and/or the wafer compound.

The converter element 5 may advantageously comprise a planar shape with a constant thickness and advantageously may extend laterally beyond the semiconductor chips 10a or the wafer composite. For example, the converter element 5 has a thickness of greater than 100 μm or greater than 200 μm. The converter element 5 advantageously has a flat surface. The converter element 5 may advantageously comprise a roughening on the emission side. Before singulating, the converter element 5 may comprise, for example, a round shape in plan view. After singulation, the converter element 5 can extend in the lateral direction a few μm beyond the semiconductor chip 10a, for example, on all sides of the semiconductor chip 10a. The converter element 5 advantageously has singulation tracks on lateral edges.

Similar to an outer encapsulation of the side surfaces of the semiconductor chip 10a, a reflective layer may also be applied to the side surfaces of the converter element (not shown). The reflective layer may comprise, for example, silver, aluminum, a dielectric mirror, or a combination thereof.

After method step F), the wafer composite is separated into a plurality of semiconductor chips 10. The singulation takes place, for example, by means of laser beam cutting, stealth dicing, plasma dicing or mechanical sawing, wherein advantageously the converter element 5 and the auxiliary carrier 4a are separated.

The invention is not limited by the description based on the embodiments of these. Rather, the invention comprises any novel feature as well as any combination of features, which includes in particular any combination of features in the patent claims, even if this feature or combination itself is not explicitly stated in the patent claims or exemplary embodiments.

The invention claimed is:

1. A method for producing an optoelectronic component comprising the method comprising:
provinding at least one light-emitting semiconductor chip comprising a sapphire substrate and an epitaxially grown layer sequence;
arranging the light-emitting semiconductor chip with a side facing away from the sapphire substrate on a carrier;
detaching the sapphire substrate from the light-emitting semiconductor chip;
applying a converter element on a region of the light-emitting semiconductor chip in which the sapphire substrate was detached;
arranging the light-emitting semiconductor chip on an auxiliary carrier so that the converter element faces the auxiliary carrier; and
detaching the carrier from the light-emitting semiconductor chip.

2. The method for producing the optoelectronic component according to claim 1, wherein the method takes place in the recited order.

3. The method for producing the optoelectronic component according to claim 1, wherein at least one light-emitting semiconductor chip comprises a wafer composite having a plurality of light-emitting semiconductor chips.

4. The method for producing the optoelectronic component according to claim 3, further comprising, after detaching the carrier, separating the wafer composite with the converter element and the auxiliary carrier into a plurality of optoelectronic components.

5. The method for producing the optoelectronic component according to claim 4, wherein separating comprises singulating by laser scribing, stealth dicing, plasma dicing or mechanical sawing.

6. The method for producing the optoelectronic component according to claim 3, wherein applying the converter element comprises applying the converter element to all light-emitting semiconductor chips.

7. The method for producing the optoelectronic component according to claim 1, wherein the converter element is monocrystalline.

8. The method for producing the optoelectronic component according to claim 7, wherein the converter element is anodically bonded to the epitaxially grown layer sequence.

9. The method for producing the optoelectronic component according to claim 1, wherein the converter element is coated with an adhesive layer, and wherein the converter element is glued onto the light-emitting semiconductor chip(s) with the adhesive layer.

10. The method for producing the optoelectronic component according to claim 9, wherein the adhesive layer is transparent and comprises Si.

11. The method for producing the optoelectronic component according to claim 9, wherein the adhesive layer is applied to the converter element by spin coating.

12. The method for producing the optoelectronic component according to claim 1, wherein the converter element comprises a converter material introduced into glass.

13. The method for producing the optoelectronic component according to claim 12, wherein the converter element comprises a ceramic plate or is a ceramic plate.

14. An optoelectronic component comprising:
a light-emitting semiconductor chip comprising an epitaxially grown layer sequence having a p-doped semiconductor region, an n-doped semiconductor region and an active zone, the n-doped semiconductor region facing an emission side of the light-emitting semiconductor chip;
a p-contact point and an n-contact point, both arranged on the same side of the light-emitting semiconductor chip and remote from the emission side of the light-emitting semiconductor chip;
a mirror layer arranged on the p-doped semiconductor region facing away from the n-doped semiconductor region; and
a converter element arranged on the n-doped semiconductor region and facing away from the p-doped semiconductor region,
wherein the converter element is anodically bonded to the epitaxially grown layer sequence.

15. The optoelectronic component according to claim 14, wherein the optoelectronic component comprises an outer encapsulation encapsulating the light-emitting semiconductor chip on side faces and on a side remote from the emission side, and wherein the p-contact point and the n-contact point contact through the outer encapsulation.

16. The optoelectronic component according to claim 14, wherein the converter element is monocrystalline.

17. A method for producing an optoelectronic component, the method comprising:
providing at least one light-emitting semiconductor chip comprising a sapphire substrate and an epitaxially grown layer sequence;
arranging the light-emitting semiconductor chip with a side facing away from the sapphire substrate on a carrier;
detaching the sapphire substrate from the light-emitting semiconductor chip;
applying a converter element on a region of the light-emitting semiconductor chip in which the sapphire substrate was detached, wherein the converter element is anodically bonded to the epitaxially grown layer sequence;
arranging the light-emitting semiconductor chip on an auxiliary carrier so that the converter element faces the auxiliary carrier; and
detaching the carrier from the light-emitting semiconductor chip.

* * * * *